United States Patent [19]

Vasconcelos et al.

[11] Patent Number: 5,611,393
[45] Date of Patent: Mar. 18, 1997

[54] CLAMPING HEAT SINK

[75] Inventors: Osvaldo M. Vasconcelos, Milton; Vincent Campanella, Wakefield, both of Mass.

[73] Assignee: Wakefield Engineering, Inc., Wakefield, Mass.

[21] Appl. No.: 609,770

[22] Filed: Feb. 23, 1996

[51] Int. Cl.⁶ .............................. F28F 7/00; H01L 23/02
[52] U.S. Cl. ................ 165/80.3; 165/185; 174/16.3; 257/718; 361/704; 361/707
[58] Field of Search ................... 165/80.3, 185; 174/16.3; 257/718, 719, 722; 361/702–704, 707

[56] References Cited

U.S. PATENT DOCUMENTS

| | | |
|---|---|---|
| D. 269,606 | 7/1983 | Jordan et al. |
| D. 280,811 | 10/1985 | Moore . |
| D. 283,813 | 5/1986 | McCarthy . |
| 3,407,868 | 10/1968 | Coe . |
| 3,893,161 | 7/1975 | Pesak, Jr. . |
| 4,054,901 | 10/1977 | Edwards et al. .................. 257/718 |
| 4,215,361 | 7/1980 | McCarthy .................. 257/718 |
| 4,261,005 | 4/1981 | McCarthy .................. 257/718 |
| 4,609,040 | 9/1986 | Moore .................. 165/80.3 |
| 4,729,426 | 3/1988 | Hinshaw .................. 165/80.3 |
| 4,961,125 | 10/1990 | Jordan et al. .................. 165/80.3 X |
| 5,381,041 | 1/1995 | Harmon .................. 257/718 |

*Primary Examiner*—Leonard R. Leo
*Attorney, Agent, or Firm*—Blodgett & Blodgett, P.C.

[57] ABSTRACT

A clamping heat sink formed of a thermally conductive material for releasable attachment to an electronic component. The clamping heat sink includes a horizontal base wall, a pair of vertical side walls extending upwardly from the base and a resiliently deflectable clamping element which extends downwardly from the top of each vertical wall into the rectangular channel which is formed by the base wall and vertical side walls. Each clamping element has an upper portion which extends downwardly at any angle toward the base wall and the opposite side wall and a lower portion which extends downwardly at an angle from the lower end of the upper portion toward its own side wall, the upper portion of the clamping element forming a juncture with the lower portion. Each vertical side wall has an opening which is horizontally aligned with its respective clamping element to enable the clamping element to be deflected into the opening when a semiconductor package is passed between the clamping elements, prior to positioning of the semiconductor package on the base wall of the clamping heat sink.

16 Claims, 3 Drawing Sheets

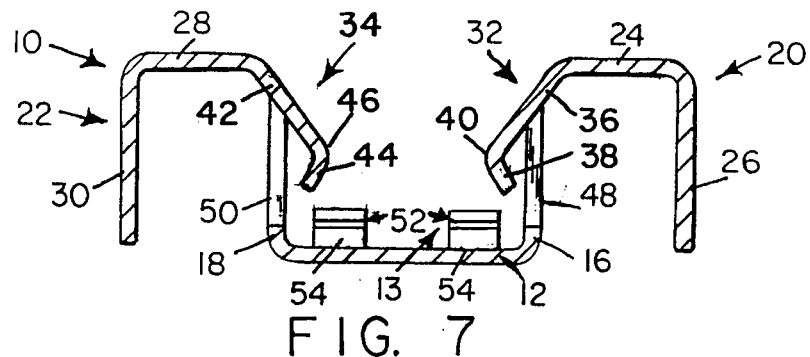
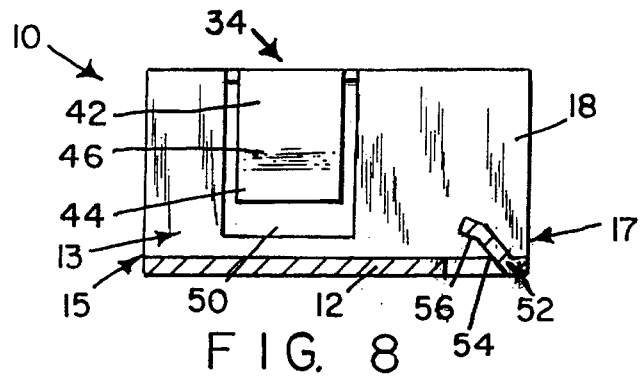
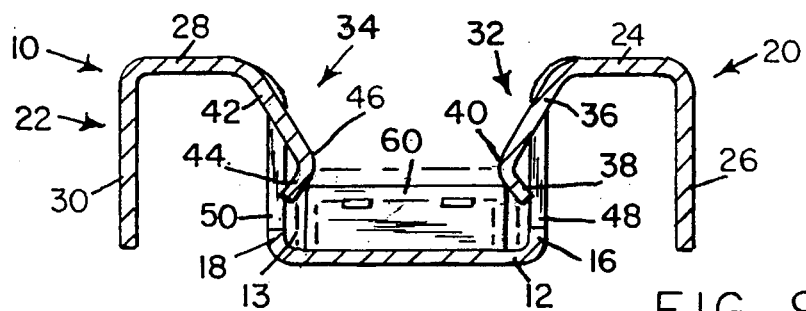
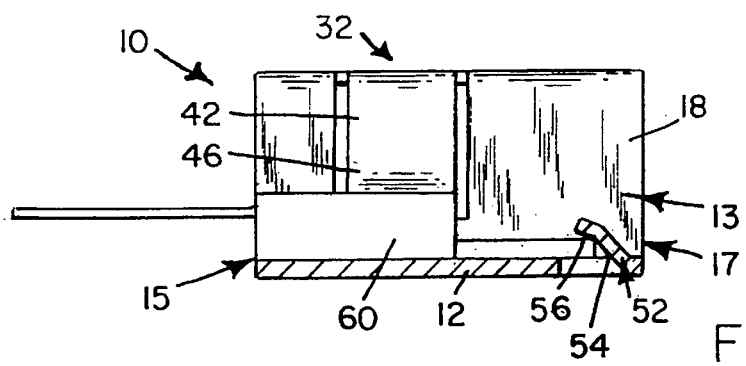

CLAMPING HEAT SINK

BACKGROUND OF THE INVENTION

The present invention is directed to an improved heat sink for clamping to an electrical component and, specifically, to an electronic semiconductor device or package, such as a TO-220. The TO-220 has a housing which contains electrical connections and metallic tabs which project from the housing. In order to dissipate the heat which is generated by such a semiconductor device, a heat sink of heat conductive material such as resilient sheet metal is applied to the semiconductor device. The heat sink is in contact with the semiconductor device for conducting heat from the semiconductor device. The heat sink also has a relatively large radiating surface for dissipation of heat from the heat sink and away from the semiconductor device.

Prior art self clamping heat sinks for semiconductor devices are awkward to apply to the semiconductor device. Many prior art clamping heat sinks require special tools to apply and to remove. As a result, the tabs which project on the semiconductor device are frequently disturbed and damaged and result in damage to the electrical connections within the semiconductor device. Other prior art heat sinks do not require special tools. However, these prior art heat sinks are difficult to apply and do not remain connected to the degree of reliability normally required in the assembling of circuit boards. In many cases, design features which enables a heat sink to be easily applied and removed from a semiconductor device also result in a diminishing of the contact area between the semiconductor device and the heat sink. This reduces the effectiveness of the heat sink to remove heat from the semiconductor device. Another problem associated with prior art heat sinks is the inability of the heat sink to be positioned in a precise manner on a semiconductor device. This can cause problems with the connections of the semiconductor device with other electronic components on a typical circuit board. Precise positioning of any component in the crowded environment of a typical circuit board can sometimes be very critical. Semiconductor devices of each particular type are available in a multiplicity of sizes, each size requiring a heat sink of a matching size. This requires a large inventory of heat sinks to accommodate an ever increasing number of semiconductor devices. The ever increasing size of heat sink inventory makes assembly of circuit boards and inventory control increasingly more difficult. These and other difficulties experienced with the prior art clamping heat sinks have been obviated by the present invention.

It is, therefore, the principal object of the invention to provide a clamping heat sink for an electronic semiconductor device which can be applied easily to the semiconductor device by hand and which remains securely in position.

Another object of the invention is the provision of a clamping heat sink which can accommodate a wide range of sizes for an electronic semiconductor device of a particular type.

Still another object of the invention is the provision of a clamping heat sink which has a large radiating surface area within a relatively small amount of physical space for efficient and effective dissipation of heat from the heat sink, A further object of the present invention is the provision of a clamping heat sink which is effective for being coupled with an electronic semiconductor device at a predetermined position on the device with a high degree of accuracy, With these and other objects in view, as will be apparent to those skilled in the art, the invention resides in the combination of parts set forth in the specification and covered by the claims appended hereto.

SUMMARY OF THE INVENTION

The present invention comprises a clamping heat sink formed of a thermally conductive material for releasable attachment to an electronic semiconductor device. The clamping heat sink includes a horizontal base wall, a pair of vertical side walls extending upwardly from the base, and a resiliently deflectable L-shaped clamping element which extends downwardly from the top of each vertical wall into the rectangular channel or enclosures which is formed by the base wall and vertical side walls. Each clamping element has an upper portion which extends downwardly toward the base and the opposite side wall and a lower portion which extends downwardly from the lower end of the upper portion toward its own side wall, the upper portion of the clamping element forming a juncture with the lower portion. More specifically, each vertical side wall has an opening which is horizontally aligned with its respective clamping element to enable the clamping element to be deflected into the opening when a semiconductor device is passed between the clamping elements, prior to positioning the semiconductor device on the base wall of the clamping heat sink.

BRIEF DESCRIPTION OF THE DRAWINGS

The character of the invention, however, may be best understood by reference to one of its structural forms, as illustrated by the accompanying drawings, in which:

FIG. 7 is a vertical cross-sectional view of the heat sink, taken along the lines of VII—VII of FIG. 4 and looking in the direction of the arrows;

FIG. 8 is a vertical cross-sectional view of the heat sink, taken along the lines of VIII—VIII of FIG. 4 and looking in the direction of the arrows;

FIG. 9 is a vertical cross-sectional view similar to FIG. 7, showing a semiconductor device within the enclosure of the heat sink; and FIG. 10 is a vertical cross-sectional view similar to FIG. 8, showing a semiconductor device of a particular type within the enclosure of the heat sink.

DESCRIPTION OF THE PREFERRED EMBODIMENT

Figure 1:
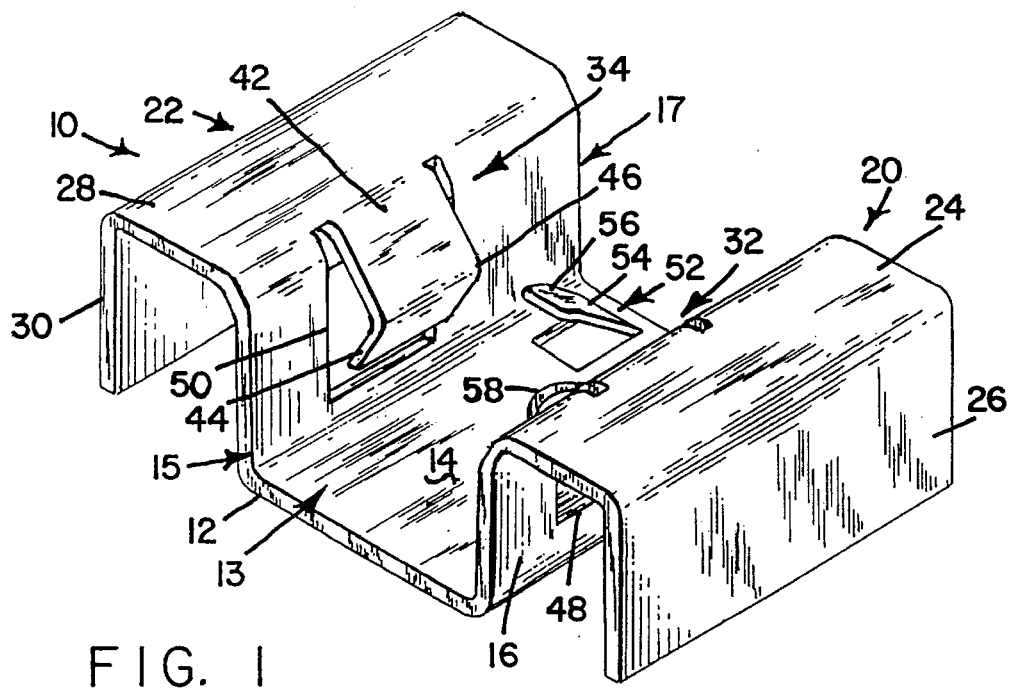
FIG. 1 is an isometric view of a clamping heat sink, embodying the principles of the present invention.
Figure 2:
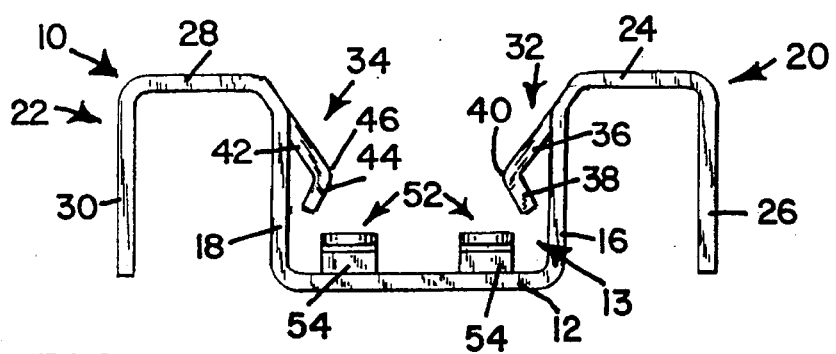
FIG. 2 is a front elevational view of the heat sink.
Figure 3:
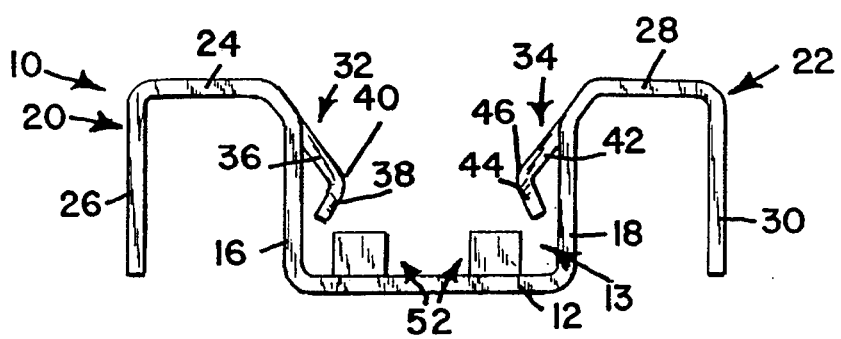
FIG. 3 is a rear elevational view of the heat sink.

Referring first to FIGS. 1–6, there is shown a preferred embodiment of the clamping heat sink of the present invention which is generally indicated by the reference numeral 10. The clamping heat sink 10 is formed from a heat conductive resilient sheet metal. The heat sink 10 has a flat horizontal base wall 12, a first vertical side wall 16, a second vertical side wall 18, a first heat dissipating fin, generally indicated by the reference numeral 20, and a second heat dissipating fin, generally indicated by the reference numeral 22. The base wall 12 has an upper surface 14. The vertical side walls 16 and 18 extend upwardly from opposite sides of the base wall 12 to form with the base wall 12 a generally rectangular channel or enclosure, generally indicated by the reference numeral 13. The channel 13 is open at the top and has front and rear openings 15 and 17, respectively. The first heat dissipating fin 20 has a horizontal top portion 24 which extends outwardly from the upper end of the first side wall 16 and a vertical outer portion 26 which extends downwardly from the outer end of the top portion 24 so that it is parallel to and spaced from the first side wall 16. The second heat dissipating fin 22 has a horizontal top portion 28 which extends outwardly from the upper end of the second vertical side wall 18 and a vertical outer portion 26 which extends downwardly from the outer end of the top portion 28 so that it is parallel to and spaced from the second side wall 18.

The clamping heat sink 10 also includes a first resiliently deflectable clamping element, generally indicated by the reference numeral 32, and a second resiliently deflectable clamping element, generally indicated by the reference numeral 34. The first clamping element 32 includes an upper portion 36 which extends downwardly into the channel or enclosure 13 from the upper end of the first vertical side wall 16 and a lower portion 38 which extends downwardly from the lower end of the upper portion 36, back toward the first vertical side wall 16. The upper end of the lower portion 38 and the lower end of the upper portion 36 form a rounded juncture 40. The second clamping element 34 has an upper portion 42 which extends downwardly into the channel 13 from the upper end of the second vertical side wall 18 and a lower portion 44 which extends downwardly, back toward the second vertical side wall 18. The upper end of the lower portion 44 forms with the lower end of the upper portion 42 a rounded juncture 46. The first vertical side wall 16 has a generally rectangular opening 48 which is horizontally aligned with the clamping element 32. The second vertical side wall 18 has an opening 50 which is horizontally aligned with the second clamping element 34. Each of the openings 48 and 50 are larger than the first and second clamping elements 32 and 34, respectively to provide clearance to enable each clamping element to be deflected into its respective opening.

The first and second clamping elements 32 and 34, respectively, are formed from the vertical side walls 16 and 18, respectively. Each of the first and second clamping elements is formed as part of a stamping process in which a three sided cut is made in the side wall and the material within the three sided cut is bent into the form shown in the drawings. Since the entire clamping heat sink is made of a springy or resiliently deflectable material such as aluminum sheet metal, the first and second clamping elements 32 and 34, respectively, are inherently resiliently deflectable.

The clamping heat sink 10 also includes a pair of tabs. Each tab 52 has a forward edge 54 which extends upwardly and forwardly at an acute angle to the base wall 12. The tabs 52 are also formed by a stamping operation. Each tab 52 is formed by making a three sided cut in the base wall 12 and bending the material within the three sided cut upwardly into the shape shown in FIGS. 1, 8 and 10. Each of the tabs 52 forms a stop or locating tab as well as a restraining element for the semiconductor device, described in more detail hereinbelow.

Figure 4:
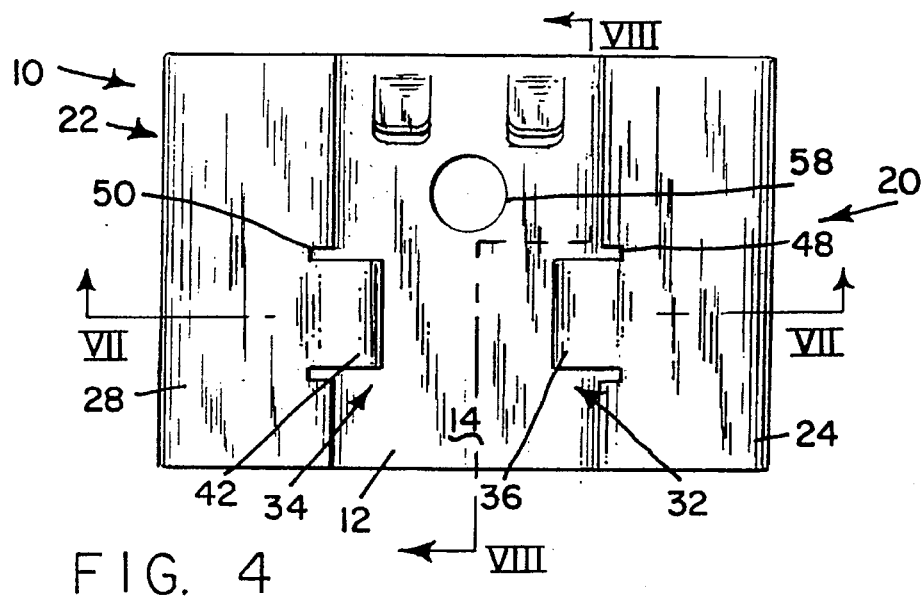
FIG. 4 is a top plan view of the heat sink.
Figure 5:
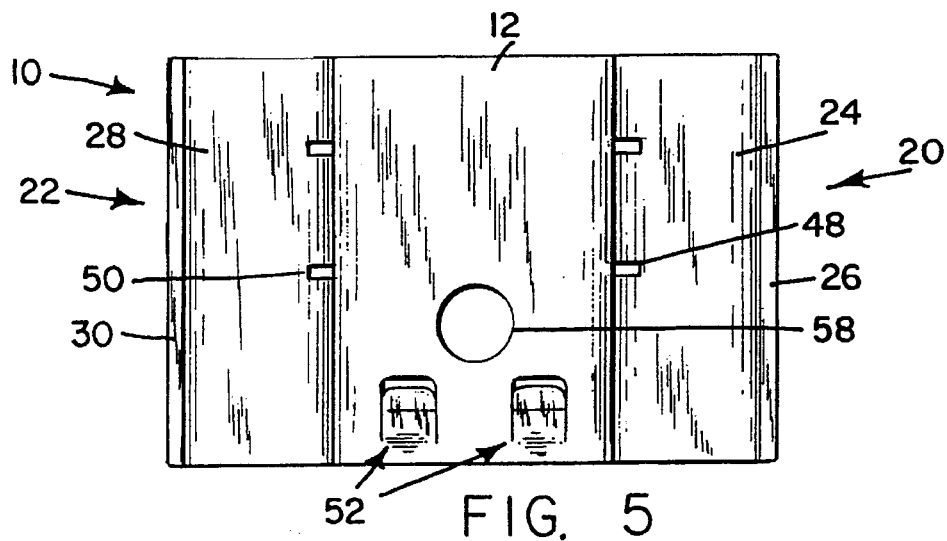
FIG. 5 is a bottom plan view of the heat sink.
Figure 6:
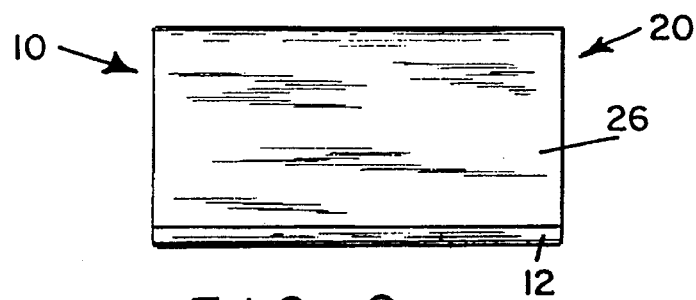
FIG. 6 is a right side elevational view of the heat sink.

Referring particular to FIGS. 4 and 5, the base wall 12 has a circular aperture 58 adjacent the tabs 52 for a purpose to be described.

The clamping heat sink 10 of the present invention is applied to an electronic semiconductive device or package such as a TO-220 by inserting the device into the channel 13 from above so that the bottom wall of the device engages the upper portions of the clamping elements 32 and 34. As the semiconductor device is forced downwardly between the junctures 40 and 46 of the first and second clamping elements 32 and 34, respectively, the clamping elements are forced outwardly into their respective apertures 48 and 50, respectively. This allows the semiconductor device to be positioned so that the bottom wall of the device engages the top surface 14 of the base wall 12. The resiliency of the clamping elements 32 and 34 enables them to spring back into the channel 13 so that they lie above the semiconductor device which is indicated by the reference numeral 60. The lower portions 38 and 44 of the clamping elements 32 and 34, respectively, engage the upper corners of the device to firmly clamp the device in position on the base wall. The rear end of the semiconductor device 60 engages the forward end of the tabs 52 to enable the semiconductor device 60 to be properly positioned and restrained on the base wall 12, whereby the aperture 62 of the semiconductor device or package is vertically aligned with the aperture 58 of the base wall 12. Since all of the deflection in the heat sink is limited to the clamping elements during coupling with a semiconductor device there is no distortions in other portions of the heat sink. This is particularly true of the base wall. The base wall remains flat to maintain good contact between the semiconductor device and the base wall. This insures good heat conduction between the base wall and the semiconductor device.

Each tab 52 has a lower portion 54 which extends upwardly from the base wall 12 at an acute angle to the base wall and an upper portion 56 which is also at an acute angle to the base wall 12. However, the angle of the upper portion 68 is substantially less than the angle of the lower portion 66, as shown most clearly in FIGS. 1, 8, and 10. The rear portion of the semiconductor device 60 is substantially thinner than the forward portion thereof. When the device 60 engages the base wall 12, it is pushed rearwardly relative to the heat sink until the rear portion of the device engages the tabs 52. The forward surfaces of the upper portions 56 of the tabs function as cam surfaces to guide the rear edge of the device 10 into engagement with the slightly more upright portions 54. The portions 54 limit the rearward motion of the device 68 relative to the heat sink 10, while the portion 56 of each tab functions as an overhang to restrain the rearward portion of the device 60 against upward movement relative to the heat sink 10. In this manner, the tabs 52 cooperate with the clamping elements to maintain the device 60 within the heat sink and in a proper orientation relative to the heat sink.

FIG. 9 illustrates the relationship between the clamping elements 32 and 34 and a typical semiconductor device or package 60. The clamping elements 32 and 34 can also accommodate larger and smaller devices of the same type, as indicated by the dot and dash lines in FIG. 9. This accommodation includes variation in both width and height of semiconductor device. This versatility is provided primary by the lower portions 38 and 40 and the fact that the clamping elements 32 and 34 can recede into their respective openings 48 and 50, respectfully.

What we claim as new and desire to secure by the Letters Patent of the U.S. is:

1. A clamping heat sink of thermally conductive material for releasable attachment to an electronic component having a bottom surface and a pair of opposite side surfaces, said clamping heat sink comprising:

(a) a horizontal base wall having a first side and a second side which is parallel to and opposite from said first side, (b) a first vertical side wall which extends upwardly from the first side of said base, said first vertical side wall having an upper end, (c) a second vertical side wall which extends upwardly from the second side of said base, said second vertical side wall having an upper end, said first and second vertical side walls defining with said base, a generally rectangular channel for receiving an electrical component;

(d) a first resiliently deflectable L-shaped clamping element which is connected to the upper end of said first vertical, said first L-shaped clamping element having an upper portion which extends downwardly from the top of said first vertical wall toward said second vertical wall to a lower end which extends downwardly from the lower end of said upper portion toward said first vertical wall, said lower portion forming a juncture with the lower end of said upper portion; and (e) a second resiliently deflectable L-shaped clamping element which is connected to the upper end of said second vertical wall, said second L-shaped clamping element having an upper portion which extends downwardly from the top of said second vertical wall and into said channel toward said first vertical wall to a lower end and a lower portion which extends downwardly from the lower end of said second portion toward said second vertical wall, the lower portion of said second L-shaped clamping element forming a juncture with the upper portion of said second L-shaped clamping element.

2. A clamping heat sink as recited in claim 1, further comprising:

(a) a first heat dissipating fin connected to said first vertical side wall; and (b) a second heat dissipating fin connected to said second vertical side wall.

3. A clamping heat sink as recited in claim 2, wherein each of said first and second heat dissipating fins comprises:

(a) a horizontal top portion which extends away from said U-shaped channel from the top of it's respective vertical side wall; and (b) a vertical outer portion which extends downwardly from said top portion and spaced from it's respective vertical side wall.

4. A clamping heat sink as recited in claim 1, wherein said clamping heat sink further comprises at least one projection which extends upwardly from said horizontal base wall for engaging one end of an electrical component which is placed on said base wall for locating said electrical component in a predetermined position on said base wall.

5. A clamping heat sink as recited in claim 4, wherein said channel has a first open end and a second open end which is opposite said first open end, and wherein said projection is adjacent said second open end and said first and second clamping elements are adjacent said first open end.

6. A clamping heat sink as recited in claim 5, wherein said first clamping element is horizontally aligned with said second clamping element.

7. A clamping heat sink as recited in claim 4, wherein said projection is an elongated tab which extends upwardly from said base wall adjacent one end of said channel toward the opposite end of said channel, said tab having a lower portion which is at an acute angle to said base wall and an upper portion which is at an acute angle to said base wall and terminates in a free end, the angle of the upper portion of said tab being substantially less than the angle of the lower portion of said tab.

8. A clamping heat sink of thermally conductive material for releasable attachment to an electrical component having a bottom surface and a pair of opposite side surfaces, said clamping heat sink comprising:

(a) a horizontal base wall having a first side and a second side which is parallel to and opposite from said first side, (b) a first vertical wall which extends upwardly from the first side of said base, said first vertical wall having an upper end and a first opening which is spaced from said base wall and said upper end, (c) a second vertical wall which extends upwardly from the second side of said base, said second vertical wall having an upper end and a second opening which is spaced from said base wall and the upper end of said second vertical wall, said first and second vertical walls defining with said base, a U-shaped channel for receiving an electrical component;

(d) a first resiliently deflectable clamping element which is connected to the upper end of said first vertical wall, said first clamping element extending downwardly from the top of said first vertical wall into said channel and toward said second vertical wall to a lower end, said first clamping element being horizontally aligned with said first opening for enabling said first clamping element to be deflected at least partially into said first opening; and (e) a second resiliently deflectable clamping element which is connected to the upper end of said second vertical wall, said second clamping element extending downwardly from the top of said second vertical wall into said channel and toward said first vertical wall, said first clamping element being horizontally aligned with said second opening for enabling said second clamping element to be deflected at least partially into said second opening.

9. A clamping heat sink as recited in claim 8, wherein the lower end of said first clamping element has a first lip which extends downwardly and towards said first vertical wall, and the lower end of said second clamping element has a second lip which extends downwardly and towards said second vertical wall, each of said first and second lips being spaced from said base wall.

10. A clamping heat sink as recited in claim 9, wherein said first and second lips is elongated and has a free end which is located at the opening in the adjacent one of said first and second vertical walls.

11. A clamping heat sink as recited in claim 8, further comprising:

(a) a first heat dissipating fin connected to said first vertical wall; and (b) a second heat dissipating fin connected to said second vertical wall.

12. A clamping heat sink as recited in claim 11, wherein each of said first and second heat dissipating fins comprises:

(a) a horizontal top portion which extends away from said U-shaped channel from the top of it's respective vertical wall; and (b) a vertical outer portion which extends downwardly from said top portion and spaced from it's respective vertical wall.

13. A clamping heat sink as recited in claim 8, wherein said clamping heat sink further comprises at least one projection which extends upwardly from said horizontal base wall for engaging one end of an electrical component which is placed on said base wall for locating said electrical component in a predetermined position on said base wall.

14. A clamping heat sink as recited in claim 13, wherein said projection is an elongated tab which extends upwardly from said base wall adjacent one end of said channel toward the opposite end of said channel, said tab having a lower portion which is an acute angle to said base wall and an upper portion which is an acute angle to said base wall and terminates in a free end, the angle of the upper portion of said tab being substantially less than the angle of the lower portion of said tab.

15. A clamping heat sink as recited in claim 8, wherein said channel has a first open end and a second open end which is opposite said first open end, and wherein said projection is adjacent said second open end and said first and second clamping elements are adjacent said first open end.

16. A clamping heat sink as recited in claim 15, wherein said first clamping element is horizontally aligned with said second clamping element.

\* \* \* \* \*

UNITED STATES PATENT AND TRADEMARK OFFICE
CERTIFICATE OF CORRECTION

PATENT NO. : 5,611,393
DATED : Mar. 18, 1997
INVENTOR(S) : Osvaldo M. Vasconcelos, Vincent Campanella It is certified that error appears in the above-indentified patent and that said Letters Patent is hereby corrected as shown below:

Item [75] of the cover page, change the listing of inventors to the following: --

Inventors: Vincent Campanella, Wakefield, Osvaldo M. Vasconcelos, Milton, both of Mass. --

Signed and Sealed this

Seventeenth Day of June, 1997

Attest:

BRUCE LEHMAN

Attesting Officer

Commissioner of Patents and Trademarks